(12) United States Patent
Sartschev et al.

(10) Patent No.: US 7,991,046 B2
(45) Date of Patent: Aug. 2, 2011

(54) CALIBRATING JITTER

(75) Inventors: Ronald A. Sartschev, Andover, MA (US); Ernest P. Walker, Weston, MA (US); Li Huang, Westlake Village, CA (US)

(73) Assignee: Teradyne, Inc., North Reading, MA (US)

( * ) Notice: Subject to any disclaimer, the term of this patent is extended or adjusted under 35 U.S.C. 154(b) by 718 days.

(21) Appl. No.: 11/750,651

(22) Filed: May 18, 2007

(65) Prior Publication Data

US 2008/0285636 A1 Nov. 20, 2008

(51) Int. Cl.
*H04B 3/46* (2006.01)
*H04B 17/00* (2006.01)
*H04Q 1/20* (2006.01)

(52) U.S. Cl. ...................................... 375/226

(58) Field of Classification Search .............. 375/222, 375/224, 226, 371, 376; 702/57, 66, 79, 702/89, 108, 116; 370/412, 416, 418, 429, 370/349, 516

See application file for complete search history.

(56) References Cited

U.S. PATENT DOCUMENTS

| | | | |
|---|---|---|---|
| 5,515,404 A * | 5/1996 | Pearce | 375/371 |
| 6,609,077 B1 | 8/2003 | Brown et al. | |
| 2002/0103609 A1 * | 8/2002 | Kuyel | 702/69 |
| 2003/0081667 A1 * | 5/2003 | Camnitz et al. | 375/226 |
| 2003/0202573 A1 * | 10/2003 | Yamaguchi et al. | 375/226 |
| 2004/0062301 A1 * | 4/2004 | Yamaguchi et al. | 375/226 |
| 2005/0097420 A1 * | 5/2005 | Frisch et al. | 714/742 |
| 2005/0127894 A1 * | 6/2005 | Wyatt | 324/76.77 |
| 2006/0023778 A1 * | 2/2006 | Bergmann et al. | 375/224 |
| 2006/0067390 A1 * | 3/2006 | Tek et al. | 375/224 |
| 2006/0069967 A1 * | 3/2006 | Almy et al. | 714/724 |
| 2006/0123303 A1 * | 6/2006 | Frame | 714/742 |
| 2006/0184332 A1 * | 8/2006 | Ishida et al. | 702/69 |
| 2006/0229835 A1 | 10/2006 | Stephens | |
| 2007/0061656 A1 * | 3/2007 | Jang et al. | 714/738 |
| 2007/0118315 A1 | 5/2007 | Panis et al. | |
| 2007/0162240 A1 * | 7/2007 | Foster et al. | 702/69 |
| 2007/0250281 A1 * | 10/2007 | Ishida | 702/89 |
| 2007/0299621 A1 | 12/2007 | Lew et al. | |
| 2008/0091371 A1 * | 4/2008 | Ishida et al. | 702/89 |

OTHER PUBLICATIONS

International Search Report and Written Opinion in Application No. PCT/US08/063865, dated Aug. 25, 2008.

* cited by examiner

*Primary Examiner* — Dac Ha
*Assistant Examiner* — Syed Haider
(74) *Attorney, Agent, or Firm* — Fish & Richardson P.C.

(57) ABSTRACT

Calibrating jitter in a communication channel between test equipment and a connection for a device under test (DUT) includes sampling test data in the communication channel at about a point of the connection to produce sampled data, where the test data travels through the communication channel at a first rate, and where the test data is sampled at a second rate that is less than the first rate, determining a first amount of jitter in the sampled data relative to the test data, and determining a second amount of jitter at about the point of connection based on the first amount of jitter.

17 Claims, 4 Drawing Sheets

CALIBRATING JITTER

TECHNICAL FIELD

This patent application relates generally to calibrating jitter and, more particularly, to calibrating jitter in a communication channel.

BACKGROUND

Automatic test equipment (ATE) refers to an automated, usually computer-driven, approach to testing devices, such as semiconductors, electronic circuits, and printed circuit board assemblies. A device being tested by the ATE is referred to as a device under test, or DUT.

During one type of testing, the ATE adds jitter to a test signal, and observes the DUT's reaction to the jitter. Tests such as this provide an indication of the DUT's tolerance to jitter. Problems arise, however, due to jitter introduced into the test signal along the communication path between the ATE and the DUT. More specifically, as a result of the jitter introduced into the test signal along the communication path, the jitter in the test signal at a connection to the DUT is different from the jitter that the ATE expects to be in the test signal, i.e., the jitter that the ATE has added to the test signal. This discrepancy between the actual jitter and expected, jitter can adversely affect testing performed by the ATE.

SUMMARY

This patent application describes calibrating jitter in a communication channel between test equipment and a DUT.

In general, this patent application describes a method of calibrating jitter in a communication channel between test equipment and a connection for a device under test (DUT). The method comprises sampling test data in the communication channel at about a point of the connection to produce sampled data. The test data travels through the communication channel at a first rate, and die test data is sampled at a second rate that is less than the first rate. The method also comprises determining a first amount of jitter in the sampled data relative to the test data, and determining a second amount of jitter at about the point of connection based on the first amount of jitter. The method may also comprise one or more of the following features, alone or in combination.

The first amount of jitter may include a third amount of jitter that is introduced during sampling. Determining the second amount of jitter may comprise processing the first amount of jitter to substantially remove effects of the third amount of jitter.

The third amount of jitter ($J_3$) may comprise jitter ($J_4$) introduced by a device used to perform the sampling and jitter ($J_5$) introduced by a strobe used to clock the device. The second amount of jitter ($J_2$) may be determined as follows:

$$J_2 = \sqrt{(J_1^2 - J_4^2 - J_5^2)},$$

where $J_1$ corresponds to the first amount of jitter.

The third amount of jitter ($J_3$) may comprise jitter ($J_4$) introduced by a device used to perform the sampling. The second amount of jitter ($J_2$) may be determined as follows:

$$J_2 = \sqrt{(J_1^2 - J_4^2)},$$

where $J_1$ corresponds to the first amount of jitter.

The device used to perform the sampling may comprise a latched comparator and/or a D flip-flop. The method may further comprise adding jitter to the test data. The jitter may comprise at least one of periodic jitter and deterministic jitter.

In general this patent application also describes a system for calibrating jitter in a communication channel. The system comprises a sampling device to sample test data in the communication channel to produce sampled data. The sampling device may be configured to sample the test data at about a point of at connection between a DUT and the communication channel. The test data travels through the communication channel at a first rate, and the test data is sampled at a second rate that is less than the first rate. The system also comprises a processing device to: determine a first amount of jitter in the sampled data relative to the test data, and determine a second amount of jitter at about the point of connection based on the first amount of jitter. The system may also comprise one or more of the following features, alone or in combination.

The first amount of jitter may include a third amount of jitter that is introduced during sampling. Determining the second amount of jitter may comprise processing the first amount of jitter to substantially remove effects of the third amount of jitter.

The third amount of jitter ($J_3$) may comprise jitter ($J_4$) introduced by a device used to perform the sampling and jitter ($J_5$) introduced by a strobe used to clock the device. The second amount of jitter ($J_2$) may be determined as follows:

$$J_2 = \sqrt{(J_1^2 - J_4^2 - J_5^2)},$$

where $J_1$ corresponds to the first amount of jitter.

The third, amount of jitter ($J_3$) may comprise jitter ($J_4$) introduced by a device used to perform the sampling. The second, amount of jitter ($J_2$) may be determined as follows:

$$J_2 = \sqrt{(J_1^2 - J_4^2)},$$

where $J_1$ corresponds to the first amount of jitter.

The sampling device may comprise a latched comparator and/or a D flip-flop. The system, may comprise test equipment to add jitter to the test data. The jitter may comprise at least one of periodic jitter and deterministic jitter.

The sampling device may be configured to sample the test data in accordance with a clock signal. The system may comprise a clock distribution device to receive the clock signal and to provide the clock signal to the sampling device.

In general, this patent application also describes automatic test equipment (ATE) comprising a device interface board comprising an interface connection for connecting to a DUT, pin electronics for generating test data for transmission over a communication channel to the interlace connection, the test data containing jitter, and an apparatus connected to the interface connection in place of the DUT. The apparatus is configured to sample the test data using an undersampling technique to produce sampled data. A processing device is configured (e.g., programmed) to use the sampled data to determine an amount of jitter in the test data at a point corresponding to the interface connection. The ATE may also include one or more of the following features, alone or in combination.

The processing device may be configured determine the amount of jitter by removing at least one of jitter produced by the apparatus and a clock signal used by the apparatus to sample the test data. The undersampling technique may comprise a walking strobe technique that samples the test data at a first frequency that is less than a second frequency of the test data, where the first frequency is not a multiple of tire second frequency. The apparatus may comprise at least one of a latched comparator and a D flip-flop, and/or a clock distribution device to receive a clock signal and to provide the clock signal to the apparatus. The apparatus may be configured to perform sampling in accordance with the clock signal.

DESCRIPTION OF THE DRAWINGS

Like reference numerals in different figures indicate like elements.

DETAILED DESCRIPTION

Figure 1:
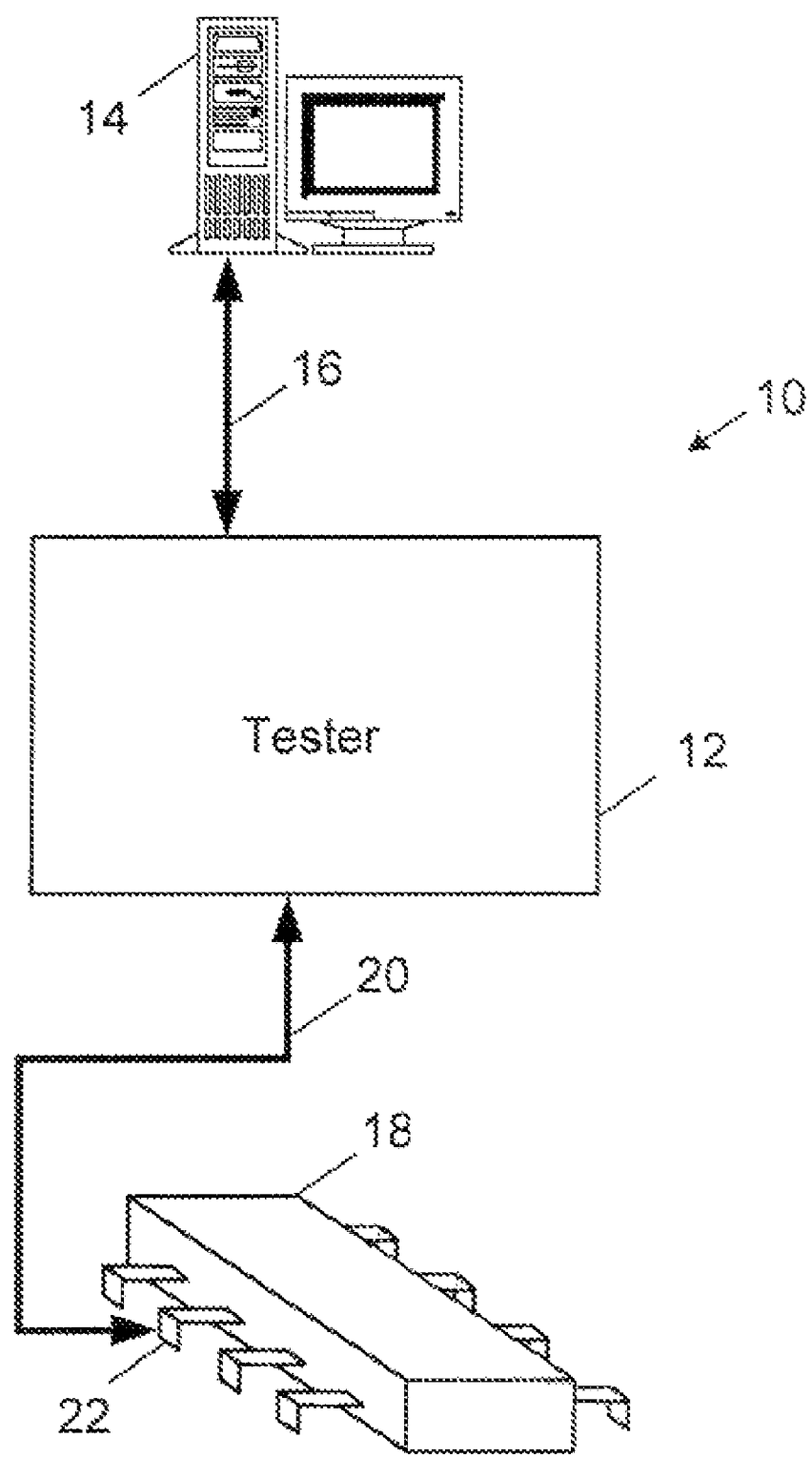
FIG. 1 is a block diagram of ATE for testing devices.

Referring to FIG. 1, an ATE system 10 for testing a device-under-test (DUT) 18, such as a semiconductor device, includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU DC test signals, PE AC test signals, etc.) to the internal circuitry of DUT 18. Conductor 20 also senses signals at pin 22 in response to the lest signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterised along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along wife performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
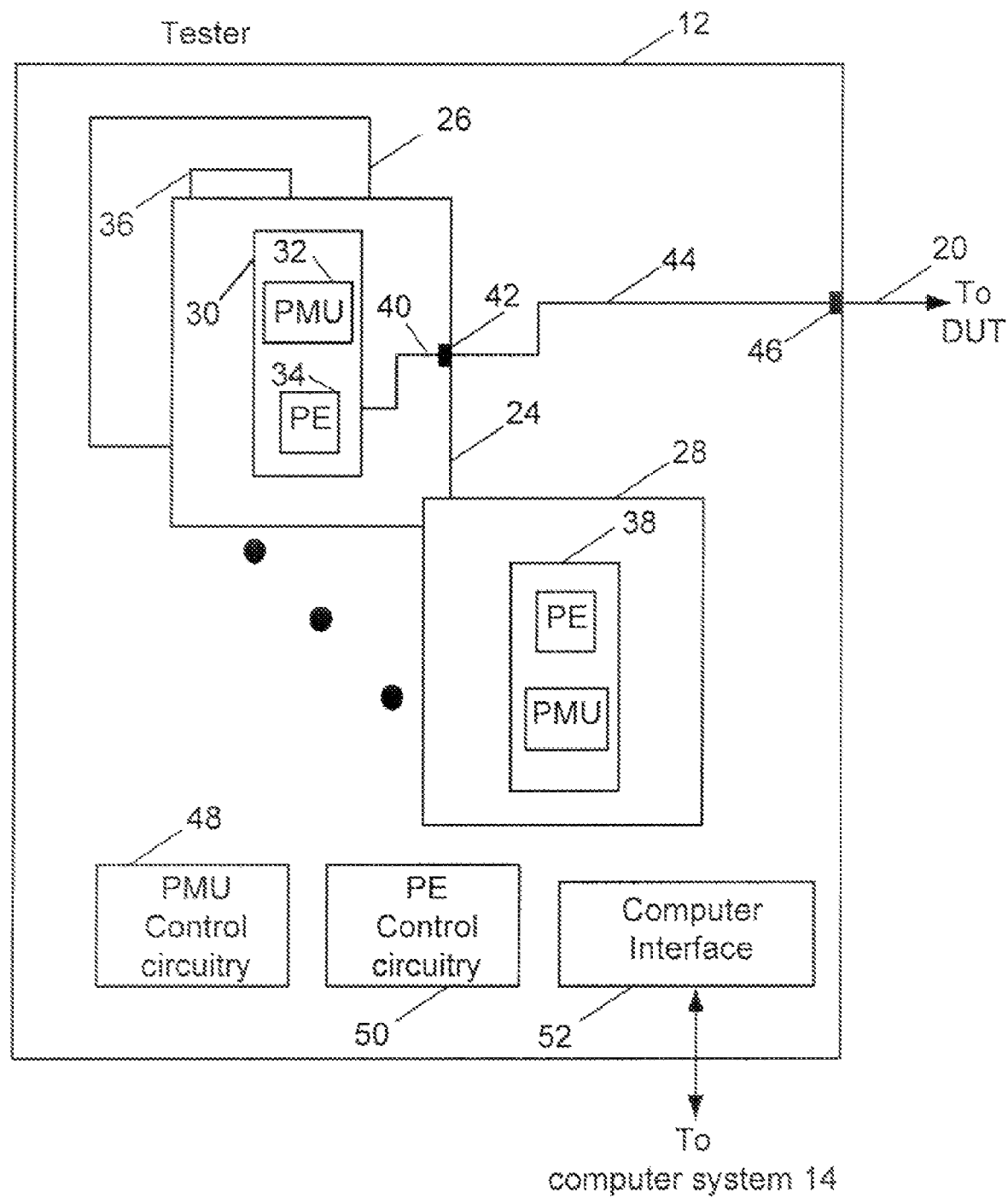
FIG. 2 is a block diagram of a tester used, in the ATE.

Referring also to FIG. 2, to send and collect test signals from, multiple connector pins of a DUT (or multiple DUTs), semiconductor device tester 12 includes an interface card 24 that can communicate with numerous pins. For example, interface card 24 may transmit test signals to e.g., 32, 64, or 128 pins and collect corresponding responses. Each communication link to a pin is typically referred to as a channel and, by providing test signals to a large number of channels, testing time is reduced since multiple tests may be performed simultaneously. Along with having many channels on an interface card, by including multiple interface cards in tester 12, the overall number of channels increases, thereby further reducing testing rime. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored. Since digital signals typically include abrupt voltage transitions, the circuitry in PE stage 34 on IC chip 30 operates at a relatively high speed in comparison to the circuitry in PMU stage 32. PE testing may also involve adding jitter to test signals and observing DUT operation in the presence of the jitter.

To pass both DC and AC test signals from interface card 24 to DUT 18, a conducting trace 40 connects IC chip 30 to an interlace board connector 42 that allows signals to be passed on and off interlace hoard 24. Interface hoard connector 42 is also connected to a conductor 44 that is connected to an interlace connector 46, which allows signals to be passed to and from tester 12. In this example, conductor 20 is connected to interface connector 46 for bi-directional signal passage between tester 12 and pin 22 of DUT 18. In some arrangements, an interface device may be used, to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interface hoard 24 for delivering and collecting signals. However, IC chip 30 (along with IC chips 36 and 38) typically has multiple pins (e.g., eight, sixteen, etc) that are respectively connected with multiple conducting traces and corresponding conductors for providing and collecting signals from the DUT (via a DIB).

Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are net limited to a microprocessor, a microcontroller, programmable logic (e.g., a field-programmable gate array), and/or combination(s) thereof. Tester 12 also includes a computer interface 52 that allows computer system 14 to control the operations executed by tester 12 and also allows data (e.g., test parameters, DUT responses, etc.) to pass between tester 12 and computer system 14.

The following describes calibrating jitter in a communication channel between a DUT and ATE, such as that shown in FIGS. 1 and 2. It is noted, however, that the calibration process is not limited to use with the ATE shown in FIGS. 1 and 2, and may be used to calibrate jitter in the communication channel of any device.

Figure 3:
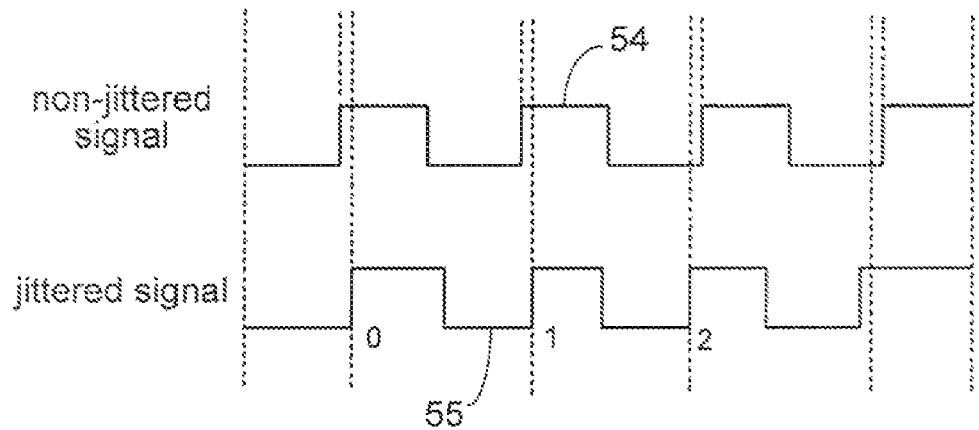
FIG. 3 is graph that illustrates bow jitter affects a signal.

As explained above, during one type of testing, ATE adds jitter to a test signal, and observes the DUT's reaction to the jitter. Tests such as this provide an indication of the DUT's tolerance to jitter. For the purposes of this application, jitter may include, and may be defined by, a variation of a signal edge from its ideal position in time. This can include time-shifting and/or elongation of the signals. For example, as shown in FIG. 3, position 54 corresponds to the ideal position of a signal and position 55 corresponds to the shifted position of the signal in the presence of jitter.

The ATE may add different types of jitter to the test signal. In this regard, jitter may generally divided into two types: deterministic jitter (DJ) and random jitter (RJ). DJ may be correlated to known sources, and can be divided into two parts; periodic jitter (PJ) and data-dependent jitter (DDJ). PJ is periodic, meaning that it repeats over time, while DDJ is substantially constant, meaning that the offset is relatively consistent across different signal edges. RJ may be produced by any number of sources or factors and, as the name suggests, does not follow any particular pattern.

Figure 4:
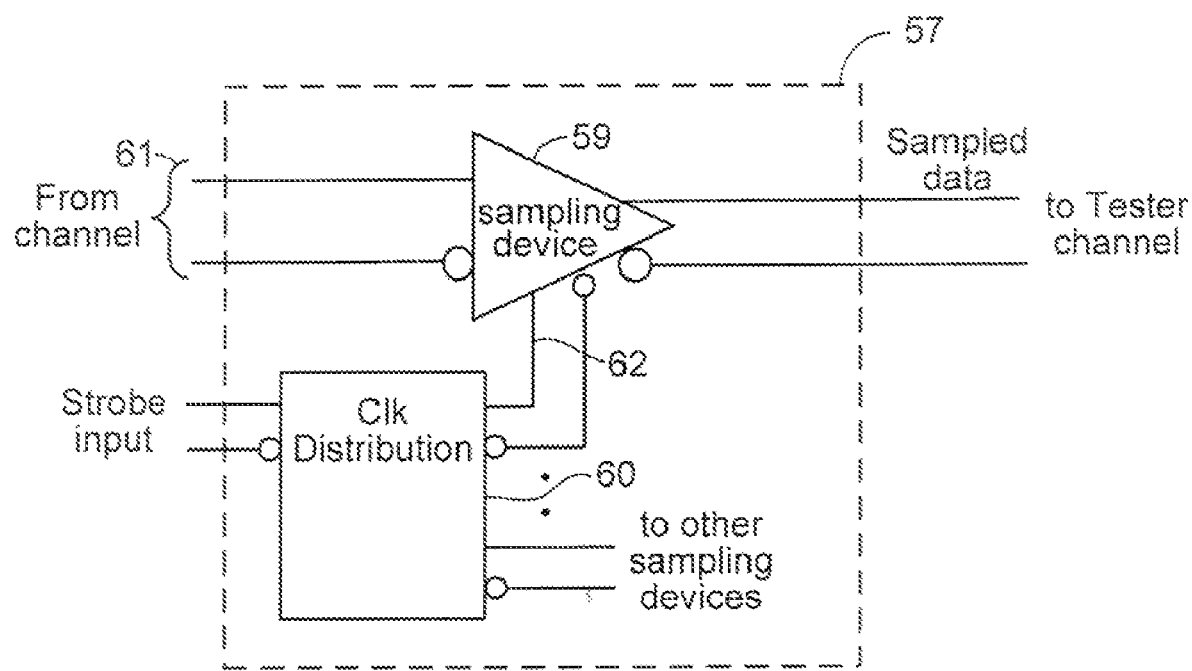
FIG. 4 is a block diagram of circuitry used in a process for measuring actual jitter in a signal at about an interface to a DUT.

FIG. 4 shows a calibration device 57, which may be used in die following process for calibrating jitter in a communication channel. Calibration device 57 is electrically connectable to the ATE. For example, calibration device 57 may be mounted at an interface connection of a DIB in lieu of a DUT. Calibration device 57 includes a sampling device 59 and a clock distribution device 60. Sampling device 59 may be any type of circuit that can sample a digital waveform sent through communication channel 61 from the ATE. For example, sampling device 59 may include a D flip-flop (D-FF) and/or a latched comparator. Sampling device 59 performs sampling in accordance with a clock signal 62 (strobe input) from the ATE. Clock distribution device 60 distributes the clock signal to the various sampling devices, including sampling device 59, on the DIB. In this regard, it is noted that a single calibration device may include multiple sampling devices for sampling test data on multiple channels. Alternatively, a single calibration device may be mounted per communication channel, and may be used in calibrating the amount of jitter in that corresponding communication channel only. In one implementation, six calibration devices are mounted on a DIB to calibrate six corresponding communication channels.

Sampling device 59 samples test data from the communication channel to produce sampled data. In this implementation, sampling device 59 samples the test data at a rate that is less than the rate at which the test data travels through the communication channel. This is known as undersampling. For example, if the test data has frequency of 1 gigahertz (GHz), and thus a period of 1 nanosecond (ns), the clock signal may have a frequency of KM) megahertz (MHz) and a period of 10 ns, which results in one sample per every tenth bit of data. For double-data-rate data, where the data is sampled at both the rising and fading edge of a clock, the dock signal may have a frequency of 50 MHz and a period of 20 ns, in one example.

In one implementation, the sampling period is not be an exact multiple of the test data period. One undersampling technique in which the sampling period is not an exact multiple of the test data period is known as a walking strobe. An example of walking strobe undersampling is described in U.S. Pat. No. 6,609,077, the contents of which are hereby incorporated by reference into this application as if set forth herein in full.

Figure 5:
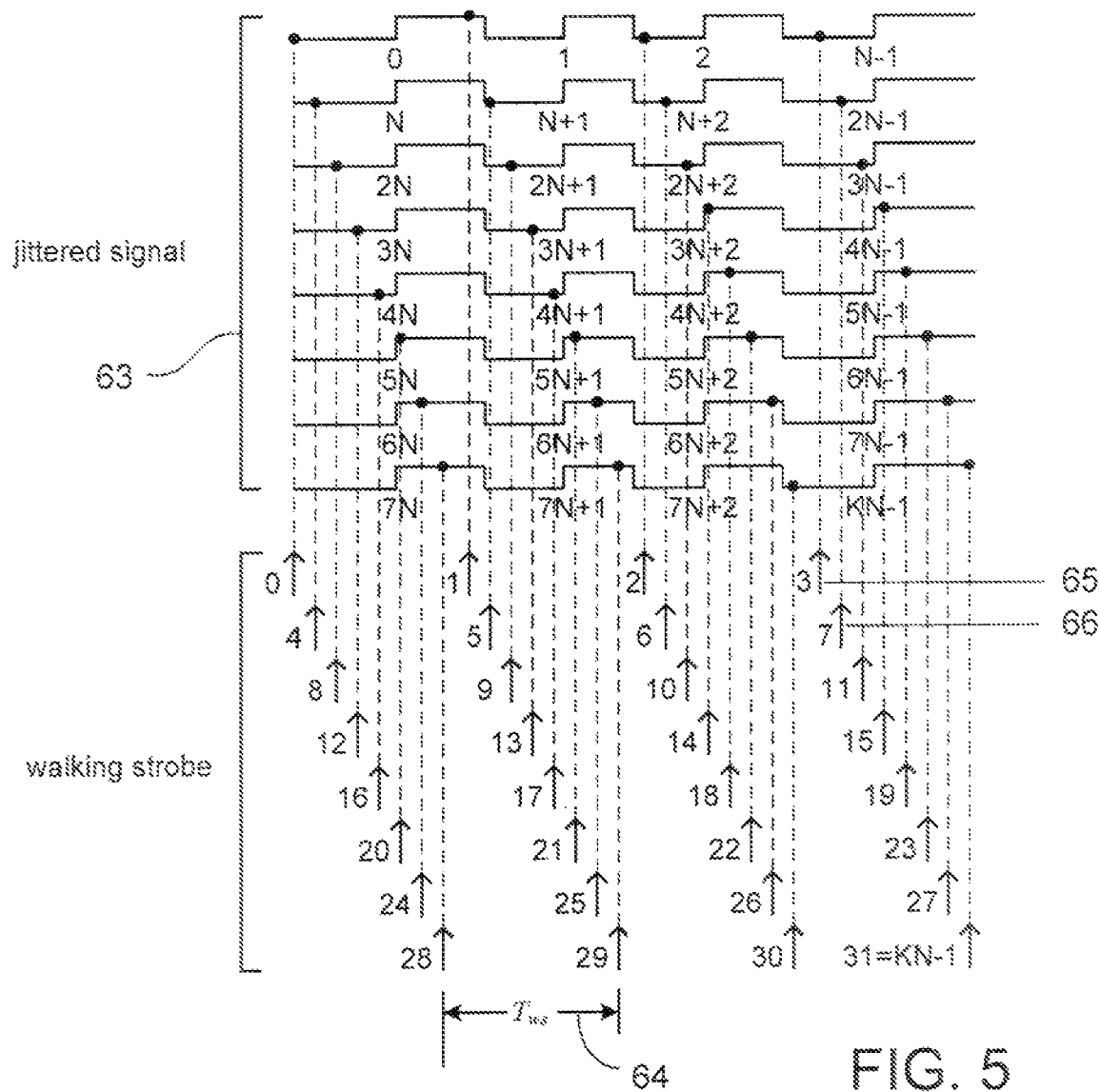
FIG. 5 is a graph that illustrates walking strobe sampling.
Figure 6:
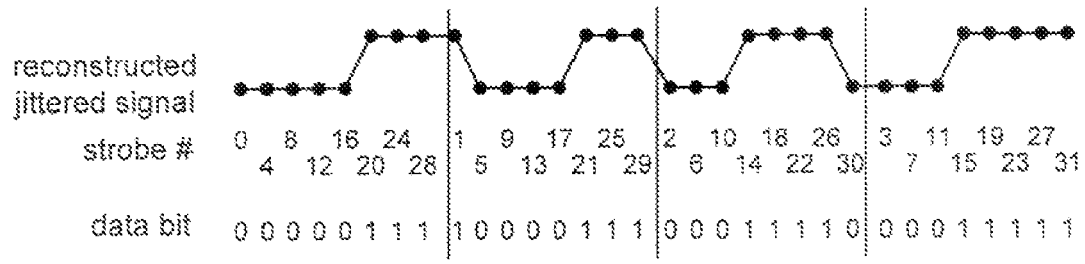
FIG. 6 is a graph that depicts a signal reconstructed using walking strobe samples.

FIGS. 5 and 6 illustrate walking strobe sampling. Referring to FIG. 5, sampling device 59 samples test data 63 in accordance with a walking strobe clock, $T_{ws}$, 64 (which may be generated by the ATE). The walking strobe clock has a frequency that is different from (e.g., less than) the frequency of the test data (the jittered signal), which results in sampling the test data at a slight offset daring each successive sampling cycle 65, 66, etc., as shown in FIG. 5. That is, sampling device 59 is "strobed" at a frequency that is different from that of the signal being measured, causing the walking strobe clock to progress across the signal at known offsets. By way of example, during a first cycle, the walking strobe clock samples the test signal 63 at points 0, 1, 2, and 3 (65). During a next cycle, the walking strobe clock is slightly offset, resulting in sampling at points 4, 5, 6 and 7 (66), and so on. The resulting samples, i.e., the captured data bits, may be used to reconstruct the test data (the jittered signal), as shown in FIG. 6.

in this implementation, the amounts of jitter added by sampling device 59 and the clock signal are relatively small in comparison to the amount of jitter in the test data. This is so in order to reduce the effects of the sampling device and the clock signal on the testing process. For example, the jitter in the test data may be on tire order of 100±10% picoseconds (ps). The amount of jitter added by the sampling device may be on the order of $\frac{1}{10}^{th}$ $ps$. A part that may be used to implement sampling device 59 is produced by Inphi®, part no. 25706PP. The amount of jitter added by the clock signal may be on the order of less than (<) 1 ps. For example, the Pico-Clock™ manufactured by Teradyne®, Inc. may be used to generate the clock signal used to sample the jittered test data.

The sampled data output by sampling device 59 is forwarded to a processing device associated with the ATE. For example, the sampled data may be provided to computer system 14 or to a microprocessor, microcontroller, or programmable logic associated with the ATE. The processing device reconstructs the jittered signal from the sampled data (see, e.g., FIG. 6), and determines the amount of jitter in the reconstructed signal by, e.g., comparing the reconstructed signal to the test data that was originally output on the communication channel.

in this regard, jitter may be introduced by the communication channel, making the jitter at about the point of contact to the DUT different from that which was predicted (e.g., the jitter introduced into the test data by the ATE). Accordingly, one purpose of the calibration process described herein is to determine the amount of jitter experienced at about the point of contact to the DUT. However, the jitter in the reconstructed signal, which is measured from the point of contact to the DUT, also includes jitter introduced by the clock signal and the sampling device. While the jitter introduced by the clock signal and the sampling device may be relatively small (as noted above), it may nevertheless affect calibration of the test equipment. Accordingly, the jitter in the reconstructed signal may be processed further to produce a value that substantially corresponds to the amount of jitter experienced at about the point of contact to the DUT. That is, the jitter introduced by the clock signal and the sampling device may be removed, at least for the most part, from the jitter in the reconstructed signal.

More specifically, let $J_2$ be the amount of jitter that substantially corresponds to the amount of jitter experienced at about the point of contact to the DUT. Let $J_1$ be the amount of jitter in the reconstructed signal, $J_4$ be the amount of jitter introduced by sampling device 59, and $J_5$ the amount of jitter introduced by the clock signal (e.g., the strobe used to clock the sampling device). The processing device determines the amount of jitter experienced at about the point of contact to the DUT ($J_2$), as follows:

$$J_2 = \sqrt{(J_1^2 - J_4^2 - J_5^2)},$$

In an alternative implementation, the sampled data output by sampling device 59 is forwarded to the processing device associated with the ATE. As above, the processing device reconstructs the jittered signal from the sampled data (see, e.g. FIG. 6), and determines the amount of jitter in the reconstructed signal by, e.g., comparing the reconstructed signal to the original test data with added jitter. In this implementation, however, the clock signal that is used for sampling by sampling device 59 is the actual clock signal used daring operation of the ATE, and not a reduced-jitter clock signal as was the case in the implementation described above. Accordingly, this implementation enables the ATE to determine the amount of jitter experienced at about die point of contact to the DUT during actual testing conditions.

In this case, the jitter introduced by sampling device 59 may be removed, at least for the most part, from the jitter in the reconstructed signal. However, the jitter produced by the clock signal is not removed. Accordingly, the processing device determines the amount of jitter experienced at about the point of contact to the OUT, as follows:

$$J_2 = \sqrt{(J_1^2 - J_4^2)},$$

where $J_1$, $J_2$ and $J_4$ correspond to the variables described above. As a result, the processing device determines the amount of jitter that a DUT would experience when connected to the ATE, e.g., mounted in place of calibration device 57.

The calibration process described above (hereinafter, "die calibration process") has numerous advantages. For example, the calibration process may be used to calibrate the ATE to test SERializer/DESerialtzer (SERDES) devices, high-performance memory devices, and data buses, such as PCI Express II. It is noted, however, that the calibration process is not limited to testing associated with such device, and may be used to calibrate the ATE to perform any types of tests on any types of devices.

The calibration process is not limited to use with the hardware and software described above. The calibration process can be implemented using any hardware and/or software. For example, the calibration process, or portion(s) thereof, can be implemented, at least in part, using digital electronic circuitry, or in computer hardware, firmware, software, or in combinations thereof.

The calibration process (e.g., the functions perforated by the processing device) can be implemented, at least in part, via a computer program product, i.e., a computer program tangibly embodied in an information, carrier, e.g., in a one or more machine-readable media or in a propagated signal, for execution by, or to control the operation of data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the calibration process can be performed by one or more programmable processors executing one or more computer programs to perform the functions of the calibration process. All or part of the ATE can be implemented as special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form, other embodiments not specifically set forth above. Other embodiments not specifically described herein are also within the scope of the following claims.

What is claimed is:

1. A method of determining jitter from a communication channel between test equipment and a connection for a device under test (DUT), the method comprising:
   connecting a sampling device to the communication channel in lieu of connecting the DUT to the communication channel, the sampling device being connected to the communication channel at a point where the DUT would connect to the communication channel;
   using the sampling device to sample test data in the communication channel at the point where the DUT would connect to the communication channel, wherein the test data travels through the communication channel at a fist rate, wherein the test data is sampled at a second rate that is less than the first rate, and wherein test data is output by test equipment to the point where the DUT would connect to the communication channel, jitter being introduced into the test data by passage of the test data through the communication channel and appearing at the point where the DUT would connect to the communication channel;
   determining a first amount of jitter in the sampled data relative to the test data; and
   determining a second amount of jitter at the point where the DUT would connect to the communication channel, the second amount of jitter comprising the jitter introduced by the passage of the test data through the communication channel.

2. The method of claim 1, wherein determining the second amount of jitter comprises substantially removing effects of jitter from one or more other sources.

3. The method of claim 2, wherein the jitter from one or more other sources comprises jitter introduced by the sampling device and jitter introduced by a strobe used to clock the sampling device.

4. The method of claim 2, wherein the jitter from one or more other sources comprises jitter introduced by the sampling device.

5. The method of claim 1, wherein the sampling device comprises a latched comparator.

6. The method of claim 1, wherein the sampling device comprises a D flip-flop.

7. The method of claim 1, further comprising:
the test equipment adding jitter to the test data, the jitter added by the test equipment comprising at least one of periodic jitter and deterministic jitter.

8. A system for determining jitter from a communication channel, comprising:
a sampling device connected to the communication channel in lieu of connecting a device under test (DUT) to the communication channel, the sampling device being connected to the communication channel at a point where the DUT would connect to the communication channel, the sampling device being configured to sample test data in the communication channel to produce sampled data, the sampling device being configured to sample the test data at the point where the DUT would connect to the communication channel, wherein the test data travels through the communication channel at a first rate, wherein the test data is sampled at a second rate that is less than the first rate, and wherein test data is output by test equipment to the point where the DUT would connect to the communication channel, jitter being introduced into the test data by passage of the test data through the communication channel and appearing at the point where the DUT would connect to the communication channel; and
a processing device to:
 determine a first amount of jitter in the sampled data relative to the test data; and
 determine a second amount of jitter at the point where the DUT would connect to the communication channel, the second amount of jitter comprising jitter introduced by passage of the test data through the communication channel.

9. The system of claim 8, wherein determining the second amount of jitter comprises substantially removing effects of jitter from one or more other sources.

10. The system of claim 9, wherein the jitter from one or more other sources comprises jitter introduced by the sampling device and jitter introduced by a strobe used to clock the device.

11. The system of claim 9, wherein the jitter from one or more other sources comprises jitter introduced by the sampling device.

12. The system of claim 8, wherein the sampling device comprises a latched comparator.

13. The system of claim 8, wherein the sampling device comprises a D flip-flop.

14. The system of claim 8, further comprising:
the test equipment to add jitter to the test data, the jitter added by the test equipment comprising at least one of periodic jitter and deterministic jitter.

15. The system of claim 8, wherein the sampling device is configured to sample the test data in accordance with a clock signal; and
wherein the system further comprises:
 a clock distribution device to receive the clock signal and to provide the clock signal to the sampling device.

16. The method of claim 1, wherein determining the second amount of jitter comprises comparing the first amount of jitter to a total amount of jitter in a signal that has been reconstructed from the sampled data.

17. The system of claim 8, wherein determining the second amount of jitter comprises comparing the first amount of jitter to a total amount of jitter in a signal that has been reconstructed from the sampled data.

* * * * *